United States Patent
Vester

(10) Patent No.: US 6,822,445 B2
(45) Date of Patent: Nov. 23, 2004

(54) METHOD AND DEVICE FOR TRANSMITTING A MAGNETIC RESONANCE SIGNAL

(75) Inventor: Markus Vester, Nuremberg (DE)

(73) Assignee: Siemens Aktiengesellschaft, Münich (DE)

( * ) Notice: Subject to any disclaimer, the term of this patent is extended or adjusted under 35 U.S.C. 154(b) by 75 days.

(21) Appl. No.: 10/256,034

(22) Filed: Sep. 26, 2002

(65) Prior Publication Data

US 2003/0062895 A1 Apr. 3, 2003

(30) Foreign Application Priority Data

Oct. 1, 2001 (DE) .......................................... 101 48 442

(51) Int. Cl.[7] .............................................. G01V 3/00
(52) U.S. Cl. ...................... 324/307; 324/309; 324/318; 324/322
(58) Field of Search ................................ 324/309, 318, 324/314, 307, 322; 600/410

(56) References Cited

U.S. PATENT DOCUMENTS

| | | | | |
|---|---|---|---|---|
| 4,994,746 A | * | 2/1991 | Panosh | 324/322 |
| 5,384,536 A | * | 1/1995 | Murakami et al. | 324/309 |
| 5,733,247 A | * | 3/1998 | Fallon | 600/410 |
| 6,198,285 B1 | * | 3/2001 | Kormos et al. | 324/318 |
| 6,400,155 B2 | * | 6/2002 | Kormos et al. | 324/318 |
| 6,433,546 B1 | * | 8/2002 | Kroeckel et al. | 324/314 |
| 6,448,770 B1 | * | 9/2002 | Liu et al. | 324/307 |
| 6,529,000 B2 | * | 3/2003 | Lou | 324/309 |
| 6,714,093 B2 | * | 3/2004 | Oppelt et al. | 333/14 |
| 2003/0062895 A1 | * | 4/2003 | Vester | 324/307 |
| 2003/0076187 A1 | * | 4/2003 | Oppelt et al. | 333/14 |

* cited by examiner

Primary Examiner—Diego Gutierrez
Assistant Examiner—Tiffany A. Fetzner
(74) Attorney, Agent, or Firm—Schiff Hardin LLP

(57) ABSTRACT

A magnetic resonance signal is compressed, so that high signal values are over-proportionally reduced, and is then supplied to an analog-to-digital converter wherein it is digitized. After transmission to reception device, the magnetic resonance signal is expanded, so that high signal values are over-proportionally amplified.

28 Claims, 2 Drawing Sheets

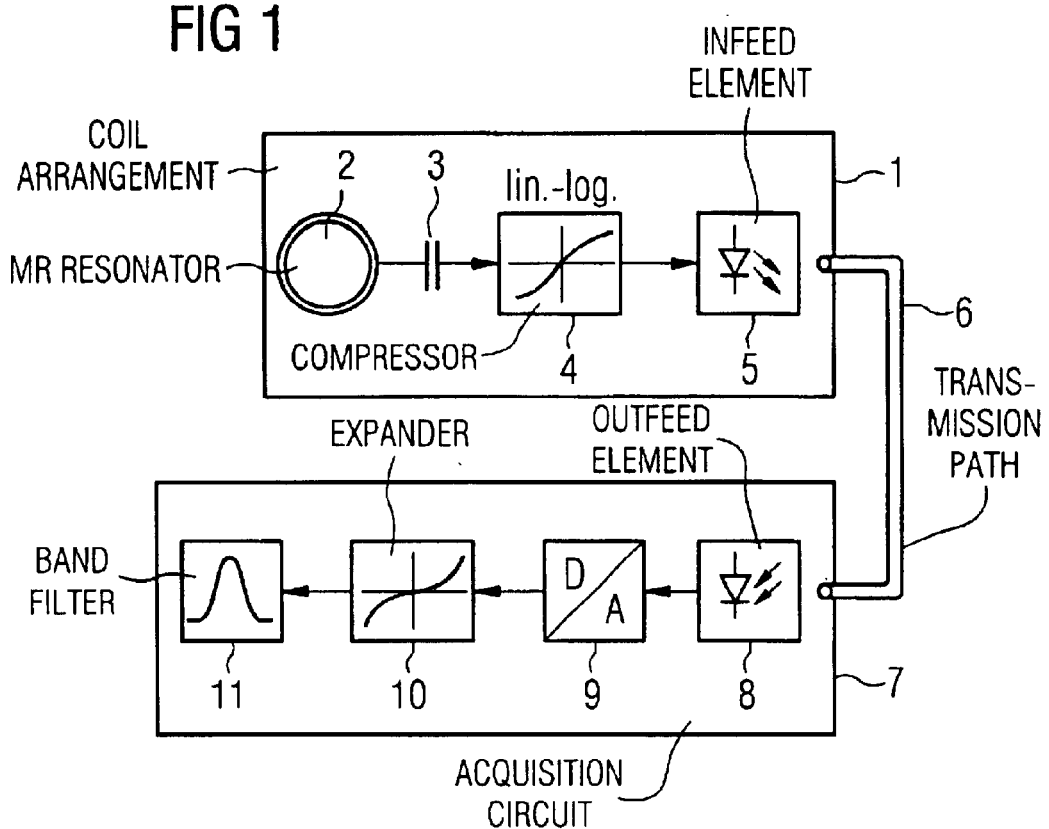
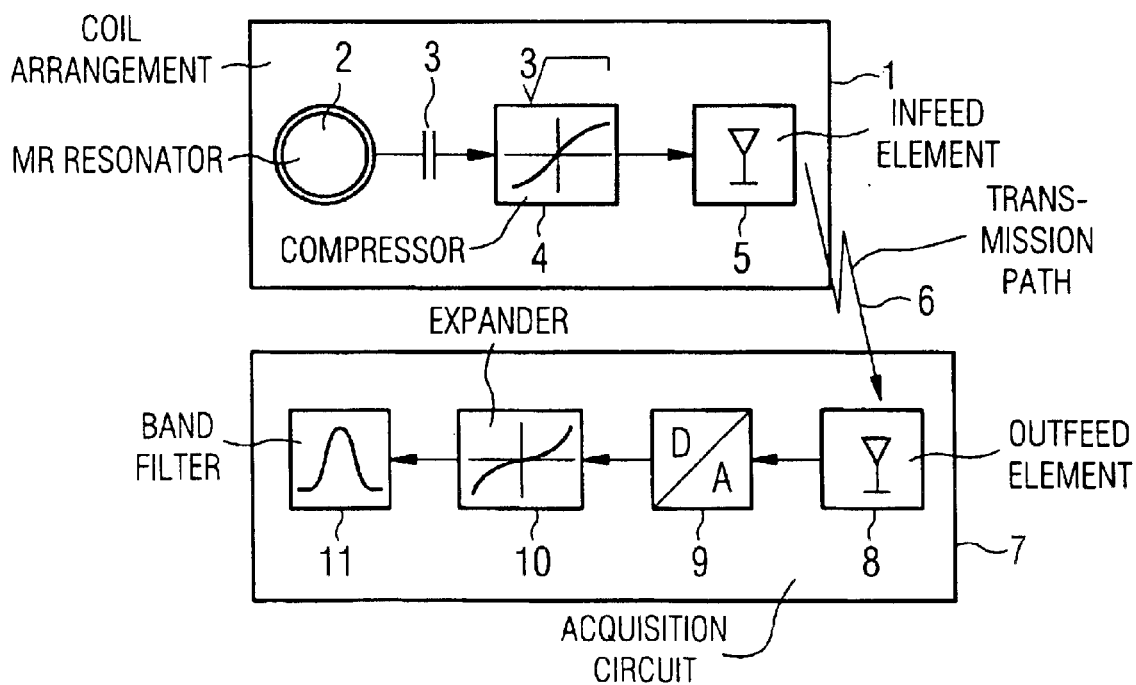

METHOD AND DEVICE FOR TRANSMITTING A MAGNETIC RESONANCE SIGNAL

BACKGROUND OF THE INVENTION

1. Field of the Invention

The present invention is directed to a transmission method for a magnetic resonance signal, wherein the magnetic resonance signal is supplied to an analog-to-digital converter and is digitized thereby, as well as to a corresponding coil arrangement for acquiring the magnetic resonance signal, a corresponding acquisition circuit for digitizing the magnetic resonance signal, and a magnetic resonance signal transmission device.

2. Description of the Prior Art

Magnetic resonance signals exhibit a large range of signal dynamics that partially lies above 90 dB. In order to be able to process such signals without noticeable degradation of the signal-to-noise ratio, the components with which the signal is processed must be able to process an even larger range of dynamics. This usually requires highly linear signal processing electronics with a relatively high power consumption, and also usually requires the employment of two-range analog-to-digital converters. Such components, some of which are special components, are comparatively expensive.

SUMMARY OF THE INVENTION

An object of the present invention is to provide a transmission method and corresponding devices with which more economical components can be employed for the transmission of signals with a large dynamic range.

The object is achieved in accordance with the invention in a transmission method wherein the magnetic resonance signal is compressed before being supplied to an analog-to-digital converter, so that high signal values are disproportionately reduced, and the magnetic resonance signal is expanded following the analog-to-digital converter after the digitization, so that high signal values are over-proportionally amplified.

The object also is achieved in accordance with the invention in a coil arrangement having a compressor, with which high signal values can be over-proportionally reduced, arranged between a resonator for the acquisition of a magnetic resonance signal and an in-feed element for feeding the magnetic resonance signal into a transmission path.

The above object is also achieved in a acquisition circuit, wherein a digital-to-analog converter is followed by an expander with which high signal values are over-proportionally amplified.

The inventive magnetic resonance signal transmission device is composed of a resonator for acquiring a magnetic resonance signal, a compressor following the resonator for over-proportional reduction of high signal values, an analog-to-digital converter following the compressor, and an expander following the analog-to-digital converter for over-proportional amplification of high signal values.

The inventive solution causes a high sensitivity for small signal to be achieved at the expense of a somewhat poorer amplitude resolution for large signals. Magnetic resonance signals, however, are already very small during the majority of the reception time span. The brief-duration, high signal maximum lasts for only a short time. A reduced resolution also can be accepted in this range.

Due to the reduced dynamics demands, it is possible in accordance with the invention to optically supply the compressed magnetic resonance signal to the analog-to-digital converter, for example via a light waveguide. It is also possible to supply the compressed magnetic resonance signal to the analog-to-digital converter without any transmission line. In particular, a radio link can be used.

It has proven optimum when the magnetic resonance signal is approximately compressed according to a substantially linear logarithm characteristic. Even when the magnetic resonance signal is compressed roughly according to an exponent characteristic with an exponent factor, however, acceptable results are obtained. When, in particular, the exponent factor is between 0.2 and 0.5, particularly between 0.3 and 0.35, for example at one-third, a compression is achieved with the exponent characteristic that is nearly as good as that deriving with a linear logarithm characteristic.

In an embodiment wherein the expanding ensues by means of a look-up table, the expansion function can be adapted in a simple way to the conditions of the system.

In a further embodiment a number of oscillations that have a uniform oscillatory frequency but different oscillatory amplitudes are supplied to the compressor for determining an expansion function of the expander, and corresponding output amplitudes of the analog-to-digital converter are acquired and the expansion function is determined on the basis of the oscillatory amplitudes and the output amplitudes. The expansion function of the expander thus is determined in an especially reliable way.

In the simplest case, the expanded magnetic resonance signal is proportional to the uncompressed magnetic resonance signal.

The magnetic resonance signal is band-filtered after the expansion. When the signal transmitted via the transmission path is band-limited, it is better when the band-filtered magnetic resonance signal is proportional to the uncompressed magnetic resonance signal.

DESCRIPTION OF THE DRAWINGS

FIGS. 1 through 3 are block diagrams of respective embodiments of a magnetic resonance signal transmission according to the invention.

DESCRIPTION OF THE PREFERRED EMBODIMENTS

Figure 3:
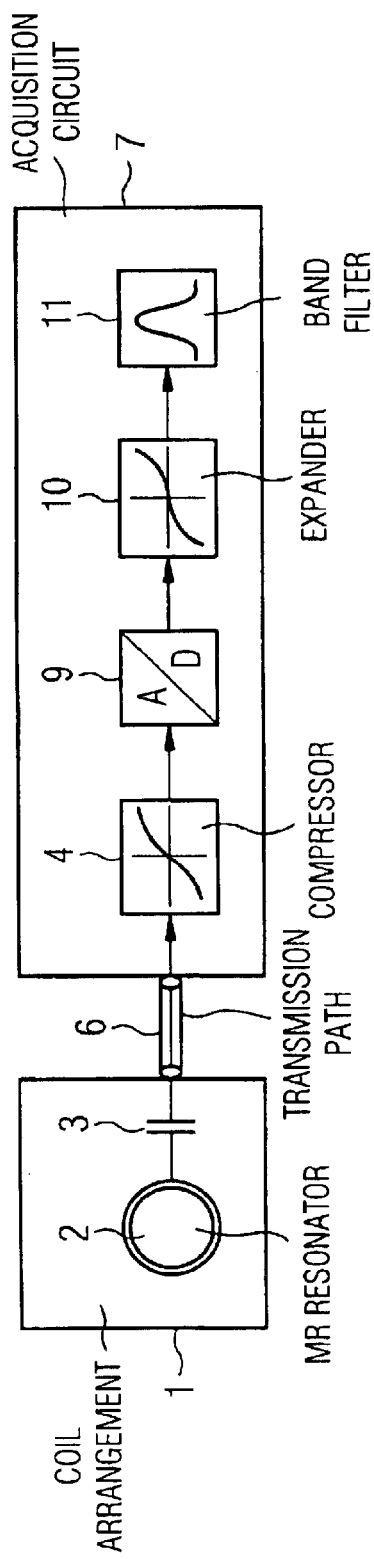

As shown in FIG. 1, a coil arrangement 1 has a resonator 2. A magnetic resonance signal can be acquired with the resonator 2. The magnetic resonance signal acquired by the resonator 2 is forwarded to a compressor 4 via a coupling capacitor 3. The magnetic resonance signal is compressed in the compressor 4, such that high signal values are disproportionately reduced.

According to FIG. 1, the compressor 4 has an approximately linear logarithmic characteristic. As long as the input signal of the compressor 4 lies below a limit value in terms of amount, the output signal is approximately linearly dependent on the input signal. When the input signal is higher then the limit value in terms of magnitude, an approximately logarithmic attenuation ensues. The limit value is at the level at which the logarithm characteristic exhibits the same slope at the limit value as the linear part of the characteristic.

The output signal of the compressor 4 is forwarded to an in-feed element 5. The output signal of the compressor 4 is coupled into a transmission path 6 with the in-feed element 5. According to FIG. 1, the transmission path 6 is fashioned as a light waveguide. The in-feed element 5 thus is a transmission element for an optical signal. Typically, the in-feed element 5 is a light-emitting diode or a laser diode.

The compressed magnetic resonance signal is optically transmitted to an acquisition circuit 7 via the transmission path 6. In the acquisition circuit 7, the signal is coupled out of the transmission path 6 via an out-feed element 8. The out-feed element 8, of course, must be fashioned as reception element for an optical signal due to the optical transmission. A photodiode or a phototransistor can be used as the out-feed element 8.

The compressed magnetic resonance signal that has been coupled out is supplied to an analog-to-digital converter 9 and is digitized therein. The digitized magnetic resonance signal is supplied to an expander 10. High signal values are over-proportionally amplified in the expander 10. The expander 10 is preferably realized as a look-up table. The expander 10 is followed by a digital band filter 11. The magnetic resonance signal is thus band-filtered after the expansion.

Due to the compression of the analog magnetic resonance signal and the expansion of the digitized magnetic resonance signal, the analog-to-digital converter 9 can have a smaller range of dynamics than without compression and expansion, for example only 12 bits compared to 16 bits.

First, the magnetic resonance signal is not compressed with a linear logarithm characteristic in the compressor 4 but with an exponent factor approximating an exponent characteristic (i.e., output=(input)$^x$). The exponent factor x typically is between 0.2 and 0.5, particularly between 0.3 and 0.35. According to FIG. 2, it is at one-third. The compressor 4, according to FIG. 2, thus realizes a characteristic approximately according to the cube root of the input signal.

Further, the transmission path 6 according to FIG. 2 is a radio path. The coupling elements 5, 8 thus are a wireless transmission element and a wireless reception element, respectively. The magnetic resonance signal thus is transmitted wirelessly between the coupling elements 5, 8.

Lastly, the transmission path 6 is band-limited. In this case, it is not the expanded magnetic resonance signal but only the band-filtered magnetic resonance signal that is proportional to the uncompressed magnetic resonance signal.

The three different properties—characteristic of the compressor 4, fashioning of the transmission path 6 and band limitation of the transmission path 6—are completely independent of one another. Arbitrary combinations of the embodiments shown in FIG. 1 and in FIG. 2 thus are possible. Further, it should be noted that the illustrations according to FIGS. 1 and 2 are simplified. Amplifier elements that only cause a linear amplification are not shown, for example.

FIG. 3 shows a further embodiment of the invention. According to FIG. 3, the analog magnetic resonance signal is transmitted uncompressed via the transmission path 6 from the coil 2 to the acquisition circuit 7. In this case, the compressor is a component of the acquisition circuit 7.

In the embodiment of FIG. 3, the transmission path 6 is a coaxial cable. An optical transmission path 6 or a radio path also is possible. In this case, however, a reduced range of dynamics must be accepted.

Figure 4:
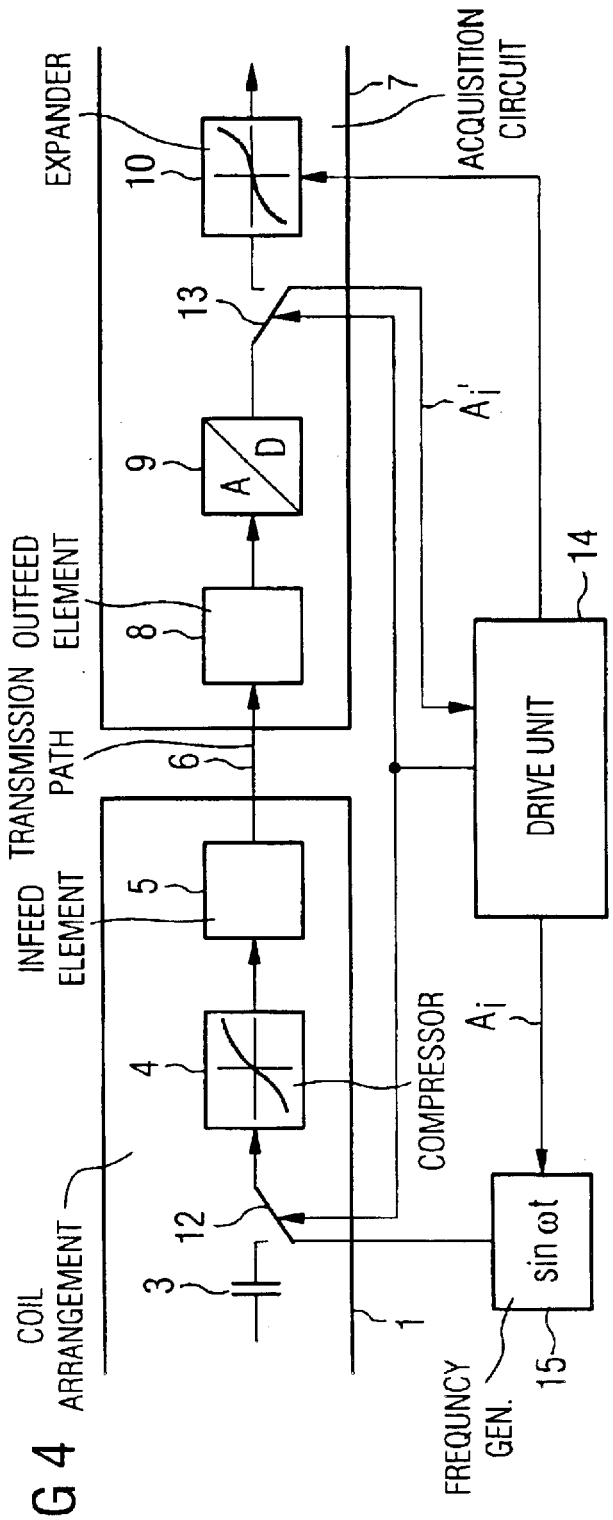
FIG. 4 illustrates a procedure for determining an expansion function of an expander according to the invention.

When the transmission path 6 is not band-limited, the expansion function of the expander 10 simply corresponds to the reverse function of the compressor 4. When, in contrast, the transmission path 6 is band-limited, the expansion function cannot be determined in such a simple way. Respective switches 12, 13 are provided preceding the compressor 4 and following the analog-to-digital converter 9 according to FIG. 4. The switches 12, 13 can be driven by a drive unit 14. With a suitable drive of the switches 12, 13, a frequency generator 15 is connected to the switch 12 and the output signal of the analog-to-digital converter 9 is supplied to the drive unit 14.

The frequency generator 15 generates a signal having a radian frequency $\omega$. The radian frequency $\omega$ thereby corresponds to the basic frequency of the magnetic resonance signal to be acquired. The drive unit 14 then successively prescribes different oscillatory amplitudes $A_i$ for the frequency generator 15. The frequency generator 15 subsequently generates a signal having the oscillatory frequency $\omega$ and the oscillatory amplitude $A_i$. A corresponding output amplitude $A_i'$ subsequently is present at the output of the analog-to-digital converter 9, and is supplied to the drive unit 14. With reference to the totality of oscillatory amplitudes $A_i$ and of output amplitudes $A_i'$, the drive unit 14 thus is able to determine the expansion function of the expander 10. The expansion function then is stored in the expander 10 by the drive unit 14.

A considerable cost-reduction in the realization of a magnetic resonance installation can be achieved with the inventive transmission method and the corresponding devices.

Although modifications and changes may be suggested by those skilled in the art, it is the intention of the inventor to embody within the patent warranted hereon all changes and modifications as reasonably and properly come within the scope of his contribution to the art.

What is claimed is:

1. A method for transmitting a magnetic resonance signal comprising the steps of:

after obtaining an analog magnetic resonance signal, compressing said analog magnetic resonance signal by over-proportionally reducing high signal values thereof, and obtaining a compressed signal equal to an exponential power of said analog magnetic resonance signal;

supplying said compressed signal to an analog-to-digital converter and converting said compressed signal into a digital signal therein; and expanding said digital signal in an expander by over-proportionally amplifying said high signal values and substantially recovering said analog magnetic resonance signal.

2. A transmission method as claimed in claim 1 comprising optically supplying said compressed signal to said analog-to-digital converter.

3. transmission method as claimed in claim 1 comprising supplying said compressed magnetic resonance signal to said analog-to-digital converter wirelessly.

4. A transmission method as claimed in claim 1 comprising selecting said exponential power in a range between 0.2 and 0.5.

5. A transmission method as claimed in claim 1 comprising selecting said exponential power in a range between 0.3 and 0.35.

6. A transmission method as claimed in claim 1 comprising selecting said exponential power to be ⅓.

7. A transmission method as claimed in claim 1 comprising employing a look-up table to expand said digital signal.

8. A transmission method as claimed in claim 1 comprising the additional steps of:
supplying a plurality of oscillating signals to said expander respectively having equal oscillatory frequencies and different oscillatory amplitudes;
identifying an amplitude of said digital signal; and
determining an expansion function for expanding said digital signal in said expander dependent on said amplitude of said digital signal and said oscillatory amplitudes of the respective oscillatory signals.

9. A transmission method as claimed in claim 1 comprising expanding said digital signal to make said digital signal correspond to said analog magnetic resonance signal before compression.

10. A transmission method as claimed in claim 1 comprising band filtering said magnetic resonance signal after expanding said digital signal to obtain a band-filtered magnetic resonance signal that corresponds to said analog magnetic resonance signal before compression.

11. A coil arrangement transmitting a magnetic resonance signal comprising:
a resonator obtaining an analog magnetic resonance signal;
a compressor compressing said analog magnetic resonance signal by over-proportionally reducing high signal values thereof, which produces a compressed signal equal to an exponential power of said analog magnetic resonance signal; and
an in-feed element supplying said compressed signal to a transmission path.

12. A coil arrangement as claimed in claim 11 wherein said in-feed element supplies said compressed magnetic resonance signal via a wireless transmission path.

13. A coil arrangement as claimed in claim 11 wherein said exponential power is in a range between 0.2 and 0.5.

14. A coil arrangement as claimed in claim 11 wherein said exponent factor is in a range between 0.3 and 0.35.

15. A coil arrangement as claimed in claim 11 wherein said exponent factor is ⅓.

16. An acquisition circuit acquiring a magnetic resonance signal, comprising:
an analog-to-digital converter which emits a digitized magnetic resonance signal at an output thereof; and
an expander supplied with said digitized magnetic resonance signal expanding said digitized magnetic resonance signal by over-proportionally amplifying high signal values of said digitized magnetic resonance signal, which produces an expanded signal equal to an exponential power of said digitized magnetic resonance signal.

17. An acquisition circuit as claimed in claim 16 wherein said out-feed element comprises an optical signal reception element.

18. An acquisition circuit as claimed in claim 16 wherein said out-feed element comprises a wirelessly transmitted signal reception element.

19. An acquisition circuit as claimed in claim 16 wherein said expander comprises a look-up table.

20. An acquisition circuit as claimed in claim 16 wherein said expander generates an expanded signal at an output thereof, and further comprising a band filter connected to said output of said expander recovering said magnetic resonance signal from said expanded signal.

21. A magnetic resonance signal transmission device transmitting a magnetic resonance signal comprising:
a resonator obtaining an analog magnetic resonance signal;
a compressor compressing said analog magnetic resonance signal by over-proportionally reducing high signal values thereof;
obtaining a compressed signal equal to an exponential power of said analog magnetic resonance signal;
an analog-to-digital converter wherein said compressed signal is converted into a digital signal therein; and an expander expanding said digital signal by over-proportionally amplifying said high signal values and substantially recovering said analog magnetic resonance signal.

22. A magnetic resonance signal transmission device as claimed in claim 21 wherein said exponential power is in a range between 0.2 and 0.5.

23. A magnetic resonance signal transmission device as claimed in claim 21 wherein said exponential power is in a range between 0.3 and 0.35.

24. A magnetic resonance signal transmission device as claimed in claim 21 wherein said exponential power is ⅓.

25. A magnetic resonance signal transmission device as claimed in claim 21 wherein said expander comprises a look-up table to expand said digital signal.

26. A magnetic resonance signal transmission device as claimed in claim 21 further comprising:
a signal generator which supplies a plurality of oscillating signals to said expander respectively having equal oscillatory frequencies and different oscillatory amplitudes; and
a drive unit which identifies an amplitude of said digital signal, and determines an expansion function that expands said digital signal in said expander dependent on said amplitude of said digital signal and said oscillatory amplitudes of the respective oscillatory signals.

27. A magnetic resonance signal transmission device as claimed in claim 21 wherein said expander expands said digital signal making said digital signal correspond to said analog magnetic resonance signal before compression.

28. A magnetic resonance signal transmission device as claimed in claim 21 further comprising a band filter that band filters said magnetic resonance signal after expanding said digital signal and obtains a band-filtered magnetic resonance signal that corresponds to said analog magnetic resonance signal before compression.

* * * * *